United States Patent
Yoshida

(10) Patent No.: US 12,249,635 B2
(45) Date of Patent: Mar. 11, 2025

(54) HIGH-VOLTAGE METAL-OXIDE-SEMICONDUCTOR TRANSISTOR

(71) Applicant: Powerchip Semiconductor Manufacturing Corporation, Hsinchu (TW)

(72) Inventor: Hiroshi Yoshida, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 374 days.

(21) Appl. No.: 17/888,494

(22) Filed: Aug. 16, 2022

(65) Prior Publication Data

US 2024/0063281 A1     Feb. 22, 2024

(51) Int. Cl.
    *H01L 29/423*   (2006.01)
    *H01L 29/06*    (2006.01)
    *H01L 29/78*    (2006.01)

(52) U.S. Cl.
    CPC ...... *H01L 29/4238* (2013.01); *H01L 29/0649* (2013.01); *H01L 29/7833* (2013.01)

(58) Field of Classification Search
    CPC .......... H01L 29/1033; H01L 29/42356; H01L 29/495; H01L 29/78; H01L 29/7725; H01L 29/775; H01L 29/778; H01L 21/28123; H01L 29/4238; H01L 29/0649; H01L 29/7833; H01L 29/4983; H01L 29/7836; H01L 29/0653; H01L 29/0684; H01L 29/0642
    See application file for complete search history.

(56) References Cited

U.S. PATENT DOCUMENTS

| | | | |
|---|---|---|---|
| 4,288,806 A * | 9/1981 | Ronen | H01L 29/41758 257/E29.12 |
| 9,070,768 B2 * | 6/2015 | Lerner | H01L 29/7828 |
| 9,859,417 B2 | 1/2018 | Hsiao et al. | |
| 9,985,129 B2 | 5/2018 | Hsiao et al. | |
| 10,468,410 B2 | 11/2019 | Lin et al. | |
| 2002/0034841 A1 * | 3/2002 | Lee | H01L 29/66772 438/149 |

(Continued)

OTHER PUBLICATIONS

"Office Action of Taiwan Counterpart Application", issued on Feb. 10, 2023, p. 1-p. 6.

*Primary Examiner* — Galina G Yushina
(74) *Attorney, Agent, or Firm* — JCIPRNET

(57) ABSTRACT

A high-voltage MOS transistor includes a semiconductor substrate, a plurality of active regions, a gate insulation layer, and a gate electrode. The active regions are defined by an isolation structure, wherein the active regions include a channel portion and two side portions, the channel portion has first opposite sides and second opposite sides, and the two side portions are at the first opposite sides of the channel portion. The gate insulation layer is disposed on a surface of the channel portion. The gate electrode is disposed on the gate insulation layer and extending on a portion of the isolation structure, wherein the gate electrode includes a pair of channel edge openings and a plurality of slits. The pair of channel edge openings are at the second opposite sides of the channel portion to expose a portion of the gate insulation layer, and the slits are disposed over the channel portion.

14 Claims, 4 Drawing Sheets

(56) References Cited

U.S. PATENT DOCUMENTS

| | | | |
|---|---|---|---|
| 2005/0098838 A1* | 5/2005 | Sasaki | H01L 29/4238 |
| | | | 257/E29.136 |
| 2006/0214223 A1* | 9/2006 | Sasaki | H01L 29/7833 |
| | | | 257/E29.268 |
| 2006/0220122 A1* | 10/2006 | Sayama | H01L 29/0878 |
| | | | 257/341 |
| 2011/0073962 A1* | 3/2011 | Chu | H01L 29/0619 |
| | | | 257/408 |
| 2016/0351709 A1 | 12/2016 | Nishikawa et al. | |
| 2017/0294505 A1* | 10/2017 | Shin | H01L 29/66689 |
| 2019/0115260 A1* | 4/2019 | Hsiao | H01L 21/8249 |
| 2020/0135851 A1 | 4/2020 | Lin et al. | |
| 2022/0005950 A1* | 1/2022 | Shafi | H01L 21/823835 |

* cited by examiner

HIGH-VOLTAGE METAL-OXIDE-SEMICONDUCTOR TRANSISTOR

BACKGROUND

Technical Field

This invention relates to a MOS (metal oxide semiconductor) transistor, and in particular relates to a high-voltage metal oxide semiconductor transistor.

Description of Related Art

HV (high-voltage) devices are utilized in many applications such as RF device and power device. However, the small width of edge parasitic transistors in a HV MOS transistor may generate hump effect, which is a hump phenomenon in Id-Vg curve resulting in the decrease of the threshold voltages and the sensitivity to bulk polarization. In addition, the large-area metal gate in the HV MOS transistor may suffer the dishing problem in metal gate formation, and thus the thickness variation of metal gate may become too high to meet the requirement of device performance.

SUMMARY

The invention provides a high-voltage MOS transistor to suppress hump in Id-Vg at HV devices and solve dishing problem in the metal gate formation.

According to an embodiment of the invention, a high-voltage MOS transistor includes a semiconductor substrate, a plurality of active regions, a gate insulation layer, and a gate electrode. The active regions are defined by an isolation structure in the semiconductor substrate, wherein the active regions include a channel portion and two side portions, the channel portion has first opposite sides and second opposite sides, and the two side portions are at the first opposite sides of the channel portion. The isolation structure has divots close to the active regions. The gate insulation layer is disposed on a surface of the channel portion. The gate electrode is disposed on the gate insulation layer and extending on a portion of the isolation structure, wherein the gate electrode includes a pair of channel edge openings and a plurality of slits. The pair of channel edge openings are at the second opposite sides of the channel portion to expose the divots and a portion of the gate insulation layer, and the slits are disposed over the channel portion.

In an embodiment of the disclosure, the pair of channel edge openings separate the gate electrode into three parts, and the high-voltage MOS transistor further includes an interconnection electrically connecting the three parts.

In an embodiment of the disclosure, the pair of channel edge openings and the plurality of slits separate the gate electrode into a plurality of parts, and the high-voltage MOS transistor further includes an interconnection electrically connecting the plurality of parts.

In an embodiment of the disclosure, the plurality of slits separates the gate electrode into a plurality of parts, and the high-voltage MOS transistor further includes an interconnection electrically connecting the plurality of parts.

In an embodiment of the disclosure, the high-voltage MOS transistor further includes a dielectric material filled in the pair of channel edge openings and the plurality of slits.

In an embodiment of the disclosure, the high-voltage MOS transistor further includes a dielectric layer disposed on the pair of channel edge openings to form an air gap in the pair of channel edge openings.

In an embodiment of the disclosure, an extension direction of the plurality of slits is parallel to the first opposite sides of the channel portion.

In an embodiment of the disclosure, an extension direction of the plurality of slits is perpendicular to the first opposite sides of the channel portion.

In an embodiment of the disclosure, the first opposite sides of the channel portion form an angle with an extension direction of the plurality of slits.

In an embodiment of the disclosure, the plurality of slits is straight line or polyline.

In an embodiment of the disclosure, the high-voltage MOS transistor further includes a plurality of high-voltage LDD (lightly-doped drain) regions in the semiconductor substrate, and each of the high-voltage LDD regions is distributed from one side of the first opposite sides of the channel portion to one of the side portions close to the one side.

In an embodiment of the disclosure, a doping concentration of the plurality of high-voltage LDD regions is less than a doping concentration of the two side portions of the plurality of active regions.

In an embodiment of the disclosure, the plurality of high-voltage LDD regions and the two side portions of the plurality of active regions are n-type doping regions.

In an embodiment of the disclosure, the plurality of high-voltage LDD regions and the two side portions of the plurality of active regions are p-type doping regions.

Based on the above, according to the high-voltage MOS transistor, hump phenomenon can be suppressed by the channel edge openings at the channel edges. Moreover, dishing metal gate can be prevented by the slits formed over the active regions. The channel edge openings and the slits may be formed in the same process, thereby saving manufacturing time and cost.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The description below provides multiple embodiments or examples for implementing different features of the disclosure. Moreover, these embodiments are only exemplary and are not intended to limit the scope and application of the disclosure. Furthermore, the relative dimensions (e.g., length, thickness, spacing, etc.) and relative positions of the regions or structural components may be reduced or exaggerated for clarity. Additionally, similar or identical reference signs used in different figures indicate similar or identical components or features.

Figure 1:
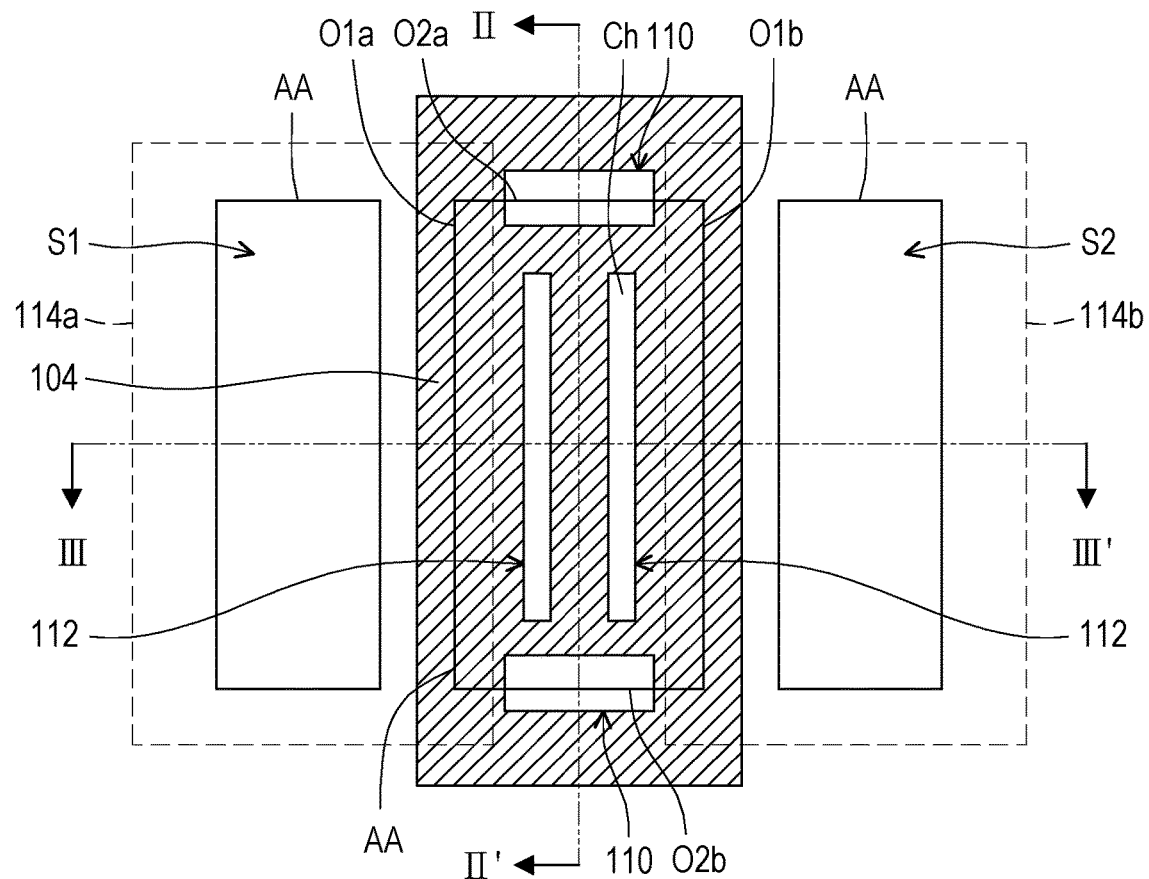
FIG. 1 is a plane view of a high-voltage MOS transistor according to a first embodiment of the invention.
Figure 2:
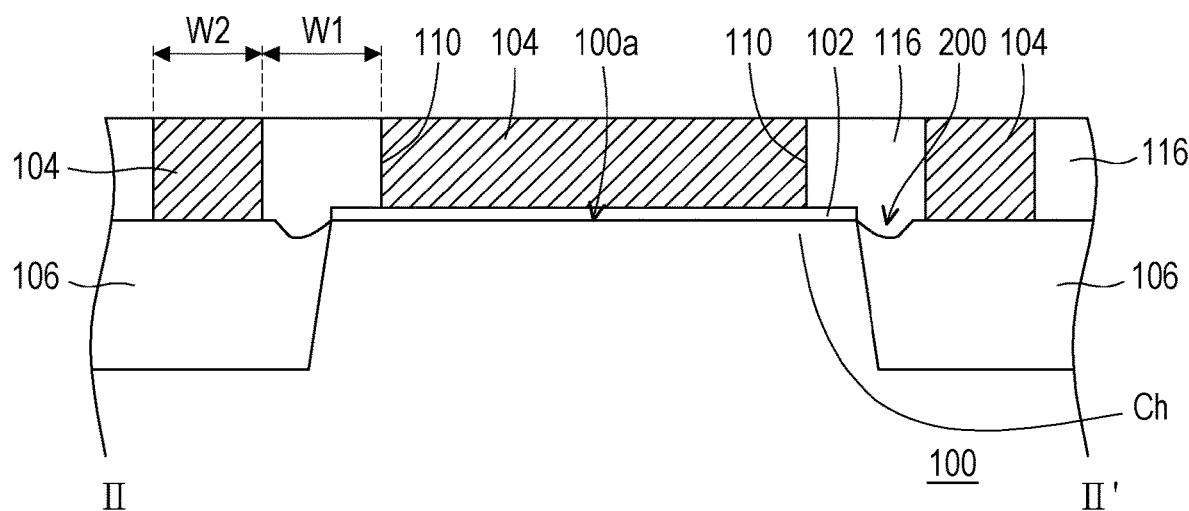
FIG. 2 is a cross-sectional view of the high-voltage MOS transistor of FIG. 1 along II-II' line.
Figure 3:
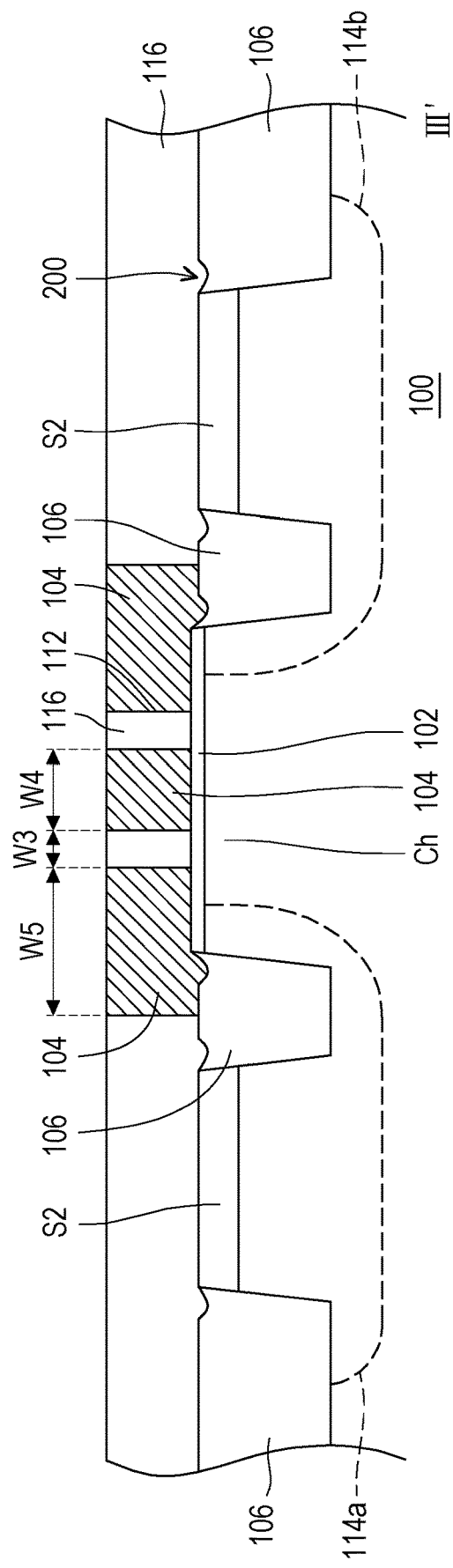
FIG. 3 is a cross-sectional view of the high-voltage MOS transistor of FIG. 1 along III-III' line.

FIG. 1 is a plane view of a high-voltage MOS transistor according to a first embodiment of the invention. FIG. 2 is a cross-sectional view of the high-voltage MOS transistor of FIG. 1 along II-II' line. FIG. 3 is a cross-sectional view of the high-voltage MOS transistor of FIG. 1 along III-III' line.

Referring to FIGS. 1-3, a high-voltage MOS transistor of the first embodiment includes a semiconductor substrate 100, a plurality of active regions AA, a gate insulation layer 102, and a gate electrode 104. The active regions AA are defined by an isolation structure 106 in the semiconductor substrate 100, wherein the active regions AA include a channel portion Ch and two side portions S1 and S2. The channel portion Ch has first opposite sides O1a-O1b and second opposite sides O2a-O2b. The two side portions S1 and S2 are at the first opposite sides O1a and O1b of the channel portion Ch and utilized as source/drain of the high-voltage MOS transistor.

Since the semiconductor process usually includes one or more cleaning and/or stripping steps for removing residual elements such as oxides (not shown) on the semiconductor substrate 100, the isolation structure 106 may be etched during these cleaning or stripping steps, and divots 200 are thus formed on the surface of the isolation structure 106 close to the active regions AA as shown in FIGS. 2-3. The divots 200 result from the etching by a chemical etching solution, and are due to faster etching speeds of the isolation structure 106 close to the active regions AA than further from the active regions AA. This difference in etching speed is due to various phenomena such as local concentration variations of the chemical solution during etching.

Referring to FIGS. 1-2 again, the gate insulation layer 102 is disposed on a surface 100a of the channel portion Ch, and the gate electrode 104 is disposed on the gate insulation layer 102 and extending on a portion of the isolation structure 106. The gate insulation layer 102 includes silicon oxide or a high-k dielectric material. The high-k dielectric material is, for example, $HfO_2$, $HfSiO_4$, HfSiON, AlN, $Al_2O_3$, $La_2O_3$, $Ta_2O_5$, $Y_2O_3$, $ZrO_2$, $SrTiO_3$, $ZrSiO_4$, $HfZrO_4$, SBT ($SrBi_2Ta_2O_9$), PZT ($PbZrTiO_3$), BST ($BaSrTiO_3$), or a combination thereof. The gate electrode 104 includes a pair of channel edge openings 110 and a plurality of slits 112. The pair of channel edge openings 110 are at the second opposite sides O2a and O2b of the channel portion Ch to expose the divots 200 and a portion of the gate insulation layer 103. In one embodiment, each of the pair of channel edge openings 110 has a length equal to the length of each of the second opposite sides O2a and O2b. In some embodiments, each of the channel edge openings 110 has a width W1 along the II-II' line, and the width W1 is, for example, 0.3 μm to 0.4 μm. In this case, the distance W2 form the edge of the gate electrode 104 to the closest edge of the channel edge opening 110 along the II-II' line is, for example, less than 2 μm. Since the gate electrode 104 is out of the channel edge (i.e. the second opposite sides O2a and O2b of the channel portion Ch), parasitic MOS is not generated at the channel edge, thereby suppressing hump phenomenon in Id-Vg curve of the high-voltage MOS transistor.

The slits 112 are disposed over the channel portion Ch. Although only two slits 112 are illustrated in FIG. 1, the invention is not limited thereto. In other embodiment, the number of the slits 112 may be adjusted as needed, such as three or four. In the first embodiment, an extension direction of the slits 112 is parallel to the first opposite sides O1a and O1b of the channel portion Ch, but the invention is not limited thereto. In another embodiment, the extension direction of the slits 112 may be perpendicular to the first opposite sides O1a and O1b of the channel portion Ch. In yet another embodiment, the first opposite sides O1a and O1b of the channel portion Ch may form an angle with the extension direction of the slits 112, wherein the angle is, for example, an acute angle or an obtuse angle. Moreover, the slits 112 may be straight lines as shown in FIG. 1, or polylines in some embodiments of the invention. The gate electrode 104 may include a metal gate, wherein the metal gate includes a metal layer and a work function layer. The metal layer includes Al, Ti, Ta, W, Nb, Mo, Cu, TiN, TiC, TaN, Ti/W or Ti/TiN, and the work function layer may be a P-type work function layer or an N-type work function layer. In one embodiment, the P-type work function layer includes TiN, TiC, TaN, TaC, WC or TiAlN. In one embodiment, the N-type work function layer includes TiAl, ZrAl, WAl, or HfAl.

Referring to FIGS. 1 and 3 again, each of the slits 112 has a width W3 along the III-III' line, and the width W3 is, for example, less than 0.1 μm. In this case, the spacing W4 between two of the slits 112 is, for example, less than 2 μm; and the distance W5 form the edge of the gate electrode 104 to the closest edge of the slit 112 along the III-III' line is, for example, less than 2 μm. The high-voltage MOS transistor of the first embodiment further includes a plurality of high-voltage LDD (lightly-doped drain) regions 114a-114b in the semiconductor substrate 100. The high-voltage LDD region 114a is distributed from the first opposite side O1a of the channel portion Ch to the side portion S1, and the high-voltage LDD region 114b is distributed from the first opposite side O1b of the channel portion Ch to the side portion S2. That is, the side portion S1 is within the high-voltage LDD region 114a, and the side portion S2 is within the high-voltage LDD region 114b. The high-voltage LDD region 114a may further extend below the gate insulation layer 102 near the first opposite side O1a, and the high-voltage LDD region 114b may further extend below the gate insulation layer 102 near the first opposite side O1b. A doping concentration of the high-voltage LDD regions 114a and 114b is, for example, less than a doping concentration of the two side portions S1 and S2 of the active regions AA. The high-voltage LDD regions 114a and 114b and the two side portions S1 and S2 of the active regions AA may be n-type doping regions; alternatively, p-type doping regions.

Referring to FIGS. 2 and 3 again, the high-voltage MOS transistor further includes a dielectric material 116 filled in the pair of channel edge openings 110 and the slits 112. The dielectric material 116 includes silicon oxide, silicon oxynitride, phosphosilicate glass, borophosphosilicate, fluorinated silicate glass, organosilicate glasses, silicon oxycarbide, spin on glass, spin on polymer, silicon carbide or a combination thereof. In some embodiments, the method for forming the gate electrode 104 may includes forming a whole layer of dielectric material 116 on the substrate 100, the gate insulation layer 102, the active regions AA, and the isolation structure 106; patterning the whole layer to form an opening except for the channel edge openings 110 and the slits 112; depositing a metal gate filling the opening; and then performing a planarization process (e.g., CMP) on the metal gate until the dielectric material 116 is exposed. Since the large-area gate electrode 104 has the pair of channel edge openings 110 and the slits 112 filled with the dielectric material 116, dishing problem in the metal gate formation would be solved.

However, the invention is not limited herein. In other embodiments of the disclosure, the method for forming the gate electrode 104 may includes forming a whole layer of sacrificial material (not shown) on the substrate 100, the active regions AA, and the isolation structure 106; patterning the whole layer to form a dummy gate electrode with the same shape as the gate electrode 104; depositing a whole layer of dielectric material 116 covering the dummy gate electrode; performing a planarization process (e.g., CMP) on the dielectric material 116 until the dummy gate electrode is exposed; and then replacing the dummy gate electrode by a high-k dielectric material as the gate insulation layer 102 and a metal gate as the gate electrode 104. Since the metal gate has to be done with the planarization process, the dielectric material 116 filled in the slits 112 can prevent the resulting gate electrode 104 from dishing.

Figure 4:
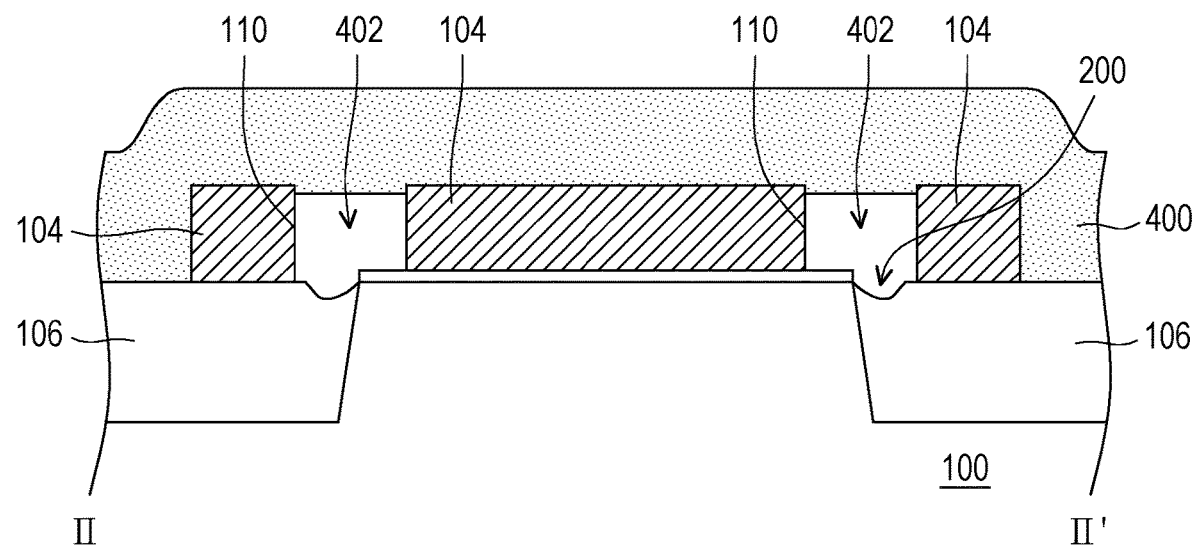
FIG. 4 is a cross-sectional view of another example of the high-voltage MOS transistor of FIG. 1 along II-II' line.

FIG. 4 is a cross-sectional view of another example of the high-voltage MOS transistor of FIG. 1 along II-II' line, wherein the reference symbols used in FIG. 2 are used to equally represent the same or similar components.

Referring to FIG. 4, the high-voltage MOS transistor further includes a dielectric layer 400 disposed on the pair of channel edge openings 110 to form an air gap 402 in the pair of channel edge openings 400. The dielectric layer 400 may cover the gate electrode 104, the isolation structure 106, and the two side portions S1 and S2 of the active regions AA. The dielectric layer 400 can be selected from the same material group as that of the dielectric material 116.

Figure 5:
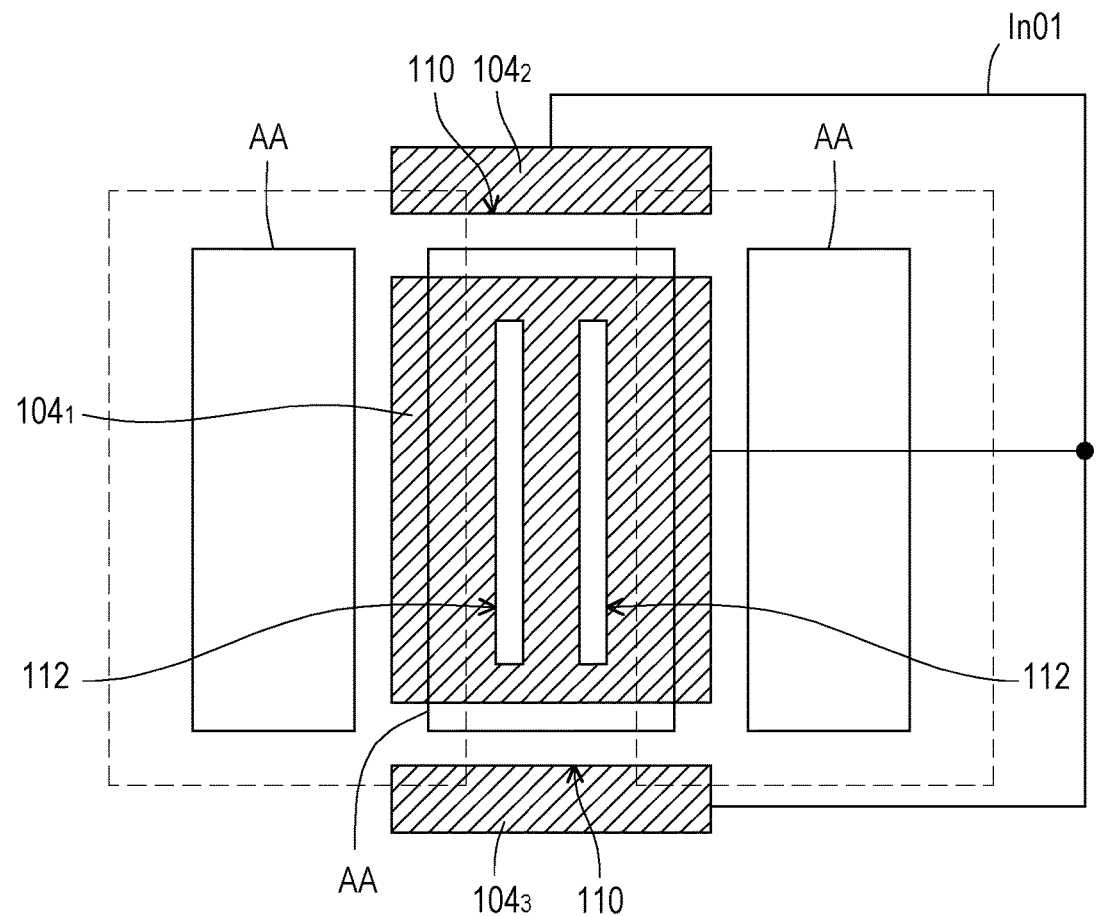
FIG. 5 is a plane view of a high-voltage MOS transistor according to a second embodiment of the invention.

FIG. 5 is a plane view of a high-voltage MOS transistor according to a second embodiment of the invention, wherein the reference symbols used in the first embodiment are used to equally represent the same or similar components.

In FIG. 5, the pair of channel edge openings 110 separate the gate electrode into three parts $104_1$, $104_2$ and $104_3$. Accordingly, the high-voltage MOS transistor of the second embodiment includes an interconnection In01 electrically connecting the three parts $104_1$, $104_2$ and $104_3$.

Figure 6:
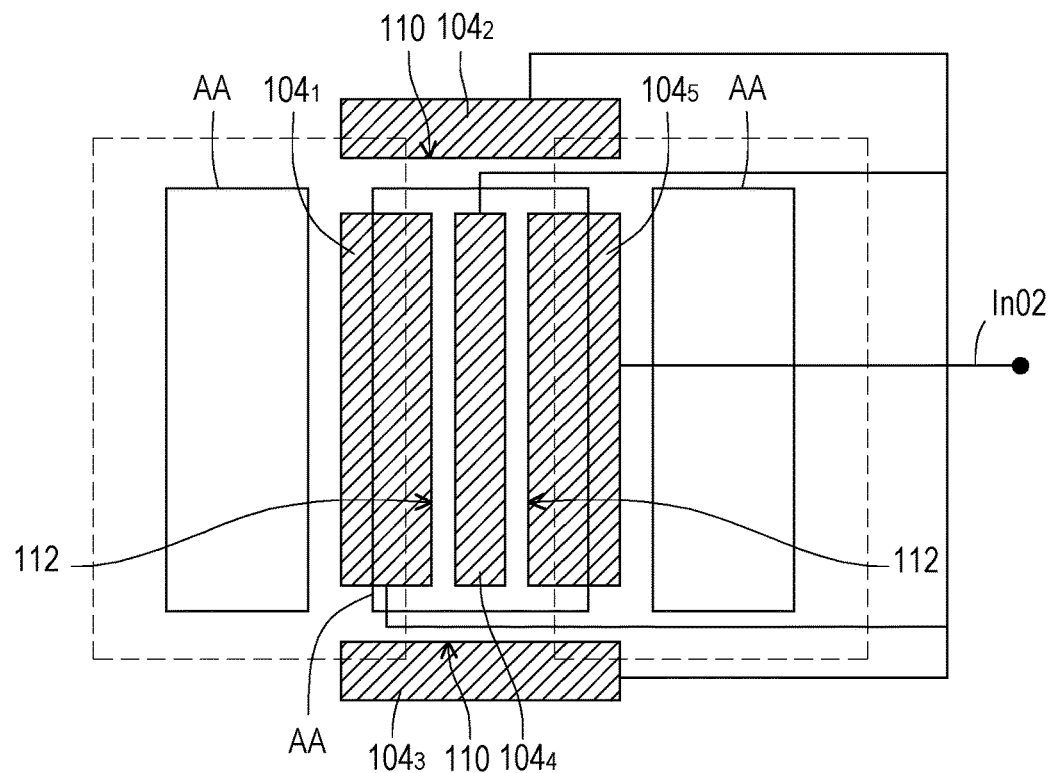
FIG. 6 is a plane view of a high-voltage MOS transistor according to a third embodiment of the invention.

FIG. 6 is a plane view of a high-voltage MOS transistor according to a third embodiment of the invention, wherein the reference symbols used in the first embodiment are used to equally represent the same or similar components.

In FIG. 6, the pair of channel edge openings 110 and the slits 112 separate the gate electrode into a plurality of parts $104_{1-5}$. Accordingly, the high-voltage MOS transistor of the third embodiment further includes an interconnection In02 electrically connecting the plurality of parts $104_{1-5}$.

Figure 7:
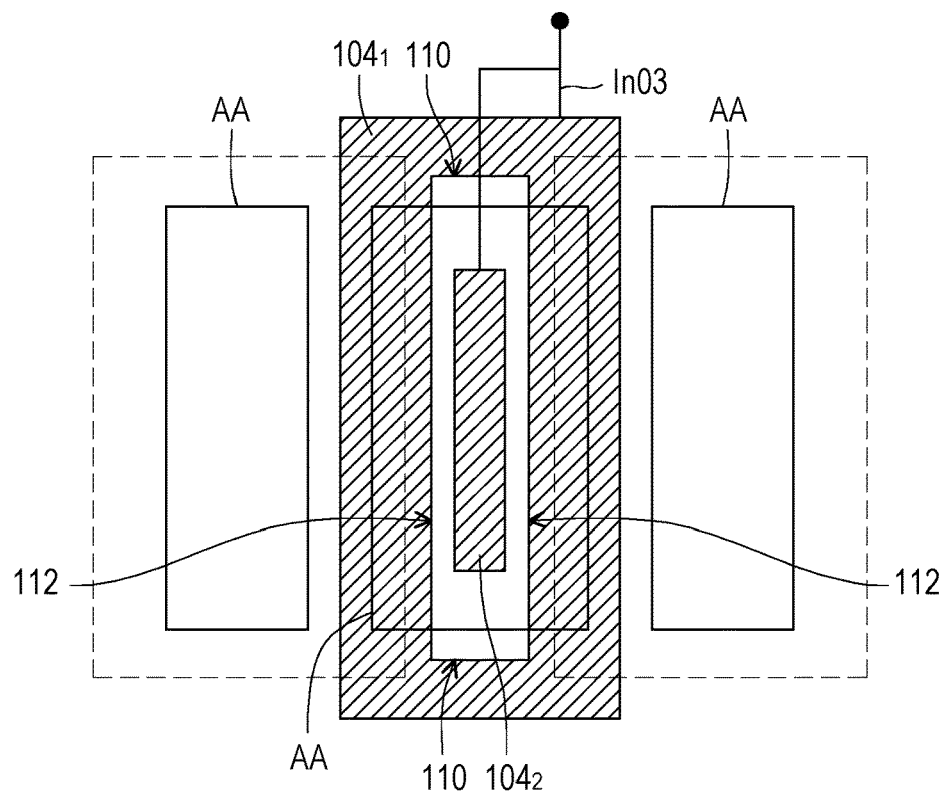
FIG. 7 is a plane view of a high-voltage MOS transistor according to a fourth embodiment of the invention.

FIG. 7 is a plane view of a high-voltage MOS transistor according to a fourth embodiment of the invention, wherein the reference symbols used in the first embodiment are used to equally represent the same or similar components.

In FIG. 7, the slits 112 separate the gate electrode into a plurality of parts $104_1$ and $104_2$, and thus the high-voltage MOS transistor of the fourth embodiment further includes an interconnection In03 electrically connecting the plurality of parts $104_1$ and $104_2$.

In summary, since the gate electrode is designed to have channel edge openings at the channel edges, hump phenomenon in high-voltage MOS transistor can be suppressed. The hump phenomenon in medium-voltage MOS transistor can be suppressed by the same manner. Moreover, the gate electrode has slits over the channel area and above channel edge openings, and thus dishing problem of the gate electrode can be solved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A high-voltage metal oxide semiconductor (MOS) transistor, comprising:
a semiconductor substrate;
a plurality of active regions defined by an isolation structure in the semiconductor substrate, wherein the plurality of active regions comprises a channel portion and two side portions, the channel portion has first opposite sides and second opposite sides, the two side portions are at the first opposite sides of the channel portion, and the isolation structure has divots close to the plurality of active regions;
a gate insulation layer disposed on a surface of the channel portion; and
a gate electrode disposed on the gate insulation layer and extending on a portion of the isolation structure, wherein the gate electrode comprises a pair of channel edge openings at the second opposite sides of the channel portion to expose the divots and a portion of the gate insulation layer, and a plurality of slits over the channel portion,
wherein the channel portion is separated from the two side portions by the isolation structure.

2. The high-voltage MOS transistor of claim 1, wherein the pair of channel edge openings separate the gate electrode into three parts, and further comprising an interconnection electrically connecting the three parts.

3. The high-voltage MOS transistor of claim 1, wherein the pair of channel edge openings and the plurality of slits separate the gate electrode into a plurality of parts, and further comprising an interconnection electrically connecting the plurality of parts.

4. The high-voltage MOS transistor of claim 1, wherein the plurality of slits separates the gate electrode into a plurality of parts, and further comprising an interconnection electrically connecting the plurality of parts.

5. The high-voltage MOS transistor of claim 1, further comprising a dielectric material filled in the pair of channel edge openings and the plurality of slits.

6. The high-voltage MOS transistor of claim 1, further comprising a dielectric layer disposed on the pair of channel edge openings to form an air gap in the pair of channel edge openings.

7. The high-voltage MOS transistor of claim 1, wherein an extension direction of the plurality of slits is parallel to the first opposite sides of the channel portion.

8. The high-voltage MOS transistor of claim 1, wherein an extension direction of the plurality of slits is perpendicular to the first opposite sides of the channel portion.

9. The high-voltage MOS transistor of claim 1, wherein the first opposite sides of the channel portion form an angle with an extension direction of the plurality of slits.

10. The high-voltage MOS transistor of claim 1, wherein each of the plurality of slits has a shape of a straight line or a polyline.

11. The high-voltage MOS transistor of claim 1, further comprising a plurality of high-voltage lightly-doped drain (LDD) regions in the semiconductor substrate, and each of the high-voltage LDD regions is distributed from one side of the first opposite sides of the channel portion to one of the side portions close to the one side.

12. The high-voltage MOS transistor of claim 11, wherein a doping concentration of the plurality of high-voltage LDD regions is less than a doping concentration of the two side portions of the plurality of active regions.

13. The high-voltage MOS transistor of claim 11, wherein the plurality of high-voltage LDD regions and the two side portions of the plurality of active regions are n-type doping regions.

14. The high-voltage MOS transistor of claim 11, wherein the plurality of high-voltage LDD regions and the two side portions of the plurality of active regions are p-type doping regions.

\* \* \* \* \*